United States Patent
Jiang

(10) Patent No.: US 10,007,061 B2
(45) Date of Patent: Jun. 26, 2018

(54) THREE-DIMENSIONAL (3D) PHOTONIC CHIP-TO-FIBER INTERPOSER

(71) Applicant: Huawei Technologies Co., Ltd., Shenzhen (CN)

(72) Inventor: Jia Jiang, Kanata (CA)

(73) Assignee: HUAWEI TECHNOLOGIES CO., LTD., Shenzhen (CN)

(*) Notice: Subject to any disclaimer, the term of this patent is extended or adjusted under 35 U.S.C. 154(b) by 0 days. days.

(21) Appl. No.: 15/491,441

(22) Filed: Apr. 19, 2017

(65) Prior Publication Data

US 2017/0219772 A1    Aug. 3, 2017

Related U.S. Application Data

(62) Division of application No. 14/703,229, filed on May 4, 2015, now Pat. No. 9,696,498.

(51) Int. Cl.
*G02B 6/26* (2006.01)
*G02B 6/134* (2006.01)
(Continued)

(52) U.S. Cl.
CPC .......... *G02B 6/1342* (2013.01); *C23C 14/042* (2013.01); *C23C 14/18* (2013.01);
(Continued)

(58) Field of Classification Search
CPC . G02B 6/305; G02B 6/26; G02B 6/36; G02B 6/1228; G02B 6/423
(Continued)

(56) References Cited

U.S. PATENT DOCUMENTS 4,262,995 A * 4/1981 Tangonan ............ G02B 6/2808
                                                     385/129
4,766,954 A * 8/1988 Bierlein .................. C30B 33/00
                                                     117/944
(Continued)

FOREIGN PATENT DOCUMENTS

CN    102656494 A    9/2012
JP     61189507 A    8/1986
(Continued)

OTHER PUBLICATIONS

Ion Exchange in Single Crystals for Integrated Optics and Optoelectronics by Korkishko published 1999.*
(Continued)

*Primary Examiner* — Thomas A Hollweg
*Assistant Examiner* — Guy Anderson
(74) *Attorney, Agent, or Firm* — Slater Matsil, LLP

(57) ABSTRACT

A method of fabricating an optical coupling device, comprising forming a waveguide mask layer on a substrate platform, wherein the waveguide mask layer comprises an array of openings comprising a first end and a second end opposite to the first end, immersing the substrate platform into a salt melt comprising ions to form an array of waveguides in the substrate platform through an ion diffusion process, and controlling a rate of immersion such that a diffusion depth of the ions varies as a function of a distance in a direction from the first end to the second end, wherein the array of waveguides extends in the direction from the first end to the second end.

20 Claims, 10 Drawing Sheets

(51) Int. Cl.
*G02B 6/30* (2006.01)
*G02B 6/122* (2006.01)
*G02B 6/12* (2006.01)
*C23C 14/48* (2006.01)
*C23C 14/04* (2006.01)
*C23C 14/18* (2006.01)
*C23C 14/54* (2006.01)
*C23C 14/58* (2006.01)

(52) U.S. Cl.
CPC ............ *C23C 14/48* (2013.01); *C23C 14/541* (2013.01); *C23C 14/542* (2013.01); *C23C 14/584* (2013.01); *C23C 14/5873* (2013.01); *G02B 6/12004* (2013.01); *G02B 6/1228* (2013.01); *G02B 6/305* (2013.01)

(58) Field of Classification Search
USPC .................................. 385/27–31, 43, 49–52
See application file for complete search history.

(56) References Cited

U.S. PATENT DOCUMENTS

| | | | | |
|---|---|---|---|---|
| 5,647,036 A * | 7/1997 | Deacon | .................... | G02F 1/035 385/27 |
| 5,724,463 A * | 3/1998 | Deacon | .................... | G02F 1/035 385/10 |
| 6,118,908 A * | 9/2000 | Bischel | .................... | G02F 1/011 385/130 |
| 6,528,780 B1 * | 3/2003 | Mitsuoka | ............... | B82Y 20/00 250/216 |
| 6,760,520 B1 * | 7/2004 | Medin | .................... | G02B 6/305 385/43 |
| 6,970,494 B1 * | 11/2005 | Bendett | .................... | C03C 4/00 372/102 |
| 7,317,535 B2 * | 1/2008 | Cheben | .................... | G01J 3/02 356/326 |
| 7,599,277 B1 * | 10/2009 | Kato | .................... | G11B 7/124 369/112.09 |
| 9,217,836 B2 * | 12/2015 | Asghari | .................... | G02B 6/423 |
| 2002/0012501 A1 | 1/2002 | Tang et al. | | |
| 2002/0131746 A1 | 9/2002 | Bayramian et al. | | |
| 2003/0044118 A1 * | 3/2003 | Zhou | .................... | G02B 6/1228 385/43 |
| 2003/0156789 A1 * | 8/2003 | Bhardwaj | ................ | G02B 6/12 385/37 |
| 2003/0196455 A1 * | 10/2003 | McCoy | .................... | C03C 21/001 65/30.13 |
| 2004/0114869 A1 | 7/2004 | Fike et al. | | |
| 2005/0072979 A1 * | 4/2005 | West | .................... | G02B 6/12 257/79 |
| 2005/0176573 A1 * | 8/2005 | Thoma | .................... | C03C 3/16 501/69 |
| 2011/0150386 A1 | 6/2011 | Dupuis et al. | | |
| 2012/0321898 A1 * | 12/2012 | Meinhardt | ............... | C03C 3/093 428/410 |
| 2013/0005606 A1 * | 1/2013 | Chakravarty | ........ | G01N 21/253 506/9 |
| 2014/0133864 A1 * | 5/2014 | Asghari | .................... | G02B 6/423 398/141 |
| 2014/0147079 A1 | 5/2014 | Doerr et al. | | |
| 2015/0044445 A1 * | 2/2015 | Garner | .................... | C03C 21/002 428/220 |
| 2015/0085351 A1 * | 3/2015 | Fontaine | ........... | H01S 3/094065 359/341.3 |
| 2016/0347655 A1 * | 12/2016 | Meinhardt | .................... | C03C 3/093 |

FOREIGN PATENT DOCUMENTS

| | | |
|---|---|---|
| JP | S61189507 A | 8/1986 |
| WO | 2015042040 A1 | 3/2015 |

OTHER PUBLICATIONS

"PLC-Transposer for Edge Coupling to Silicon PICs," Planar Lightwave Circuits Services, Packaging, and Consulting, May 8, 2013, 1 page.

Duport, 1., et al., "New integrated-optics interferometer in planar technology," Applied Optics 01, vol. 33, No. 25, Sep. 1, 1994, pp. 5954-5958.

Kopp, C., et al., "Silicon Photonic Circuits: On-CMOS Integration, Fiber Optical Coupling, and Packaging," IEEE Journal of Selected Topics in Quantum Electronics, Oct. 7, 2010, 12 pages.

Kufner, M., et al., "Ion exchange technology for optical waveguides, Single- and multimode planar lightwave circuits fabricated by ion exchange in glass" Optical components, Optik & Photonik, No. 4, Dec. 2011, pp. 32-34.

Pavarelli, N., et al., "Optical and Electronic Packaging Process for Silicon Photonic Systems," ECOC 2014, Cannes, France, Tu.1.1.3, 4 pages.

* cited by examiner

THREE-DIMENSIONAL (3D) PHOTONIC
CHIP-TO-FIBER INTERPOSER

CROSS-REFERENCE TO RELATED
APPLICATIONS

This application is a divisional of U.S. application Ser. No. 14/703,229, entitled "Three-Dimensional (3D) Photonic Chip-to-Fiber Interposer," filed on May 4, 2015, which application is hereby incorporated herein by reference.

BACKGROUND

Optical fibers have been widely used for the propagation of optical signals, especially to provide high-speed communication links. Optical links using fiber optics provide various advantages over electrical links, for example, comparatively large bandwidths, comparatively high noise immunity, comparatively reduced power dissipation, and comparatively minimal crosstalk. Optical signals carried by optical fibers may be processed by a wide variety of optical and/or optoelectronic devices, including integrated circuits.

Photonic integration is playing an increasingly important role in optical systems. Photonic integration may provide various benefits, such as a relatively smaller footprint, higher port density, reduced power consumption, and reduced cost, which may render photonic integration a promising technology for building the next generation of integrated optical devices, such as wavelength-division multiplexing (WDM) transponders, transceivers, and other types of devices. Photonic integration requires the optical coupling between an optical waveguide and an optical fiber to realize optical signal inputs and/or outputs, for example, coupling the end of an optical fiber to the surface of a photonic integrated circuit (PIC). This interface coupling is a critical technology to reduce the optical signal loss in integrated optical system.

SUMMARY

In one embodiment, the disclosure includes a method of fabricating an optical coupling device, including forming a waveguide mask layer on a surface of a substrate platform, wherein the waveguide mask layer includes an array of openings that has a first end and a second end opposite to the first end, immersing the substrate platform into a salt melt containing ions to form an array of waveguides in the substrate platform through an ion diffusion process, wherein the array of waveguides corresponds to the array of openings, and controlling a rate of immersion such that a diffusion depth of the ions varies as a function of a distance in a direction from the first end to the second end, wherein the array of waveguides extend in the direction from the first end to the second end.

In another embodiment, the disclosure includes an optical coupling device including a substrate platform including a first surface, a second surface adjacent to the first surface, and a third surface adjacent to the first surface and opposite the second surface, and an array of waveguides including a first waveguide, disposed in the substrate platform, and extending from the second surface to the third surface, wherein the array of waveguides corresponds to an array of ion-exchanged channels in the substrate platform provided by an ion-exchange process, wherein the first waveguide has a tapered structure that tapers down vertically and laterally with respect to the first surface from the second surface to the third surface.

In yet another embodiment, the disclosure includes a planar lightwave circuit (PLC) interposer including an array of input ports including a first input port and configured to couple to an array of in-plane fibers including a first fiber, and receive an optical signal from the first fiber via the first input port, an array of output ports including a first output port and configured to couple to a PIC edge coupling array, and an array of ion-exchanged waveguides including a first ion-exchange waveguide and formed in a substrate platform, wherein each ion-exchanged waveguide has a first end coupling to one of the input ports and a second end coupling to one of the output ports, wherein the first ion-exchanged waveguide is coupled to the first input port and the first output port and has a cross-sectional area that gradually decreases laterally and vertically from the first end to the second end, and wherein the first ion-exchanged waveguide is configured to gradually reduce a mode size of the optical signal laterally and vertically as the optical signal propagates towards the first output port to match a mode size of the PIC edge coupling array.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION OF ILLUSTRATIVE EMBODIMENTS

Figure 1:
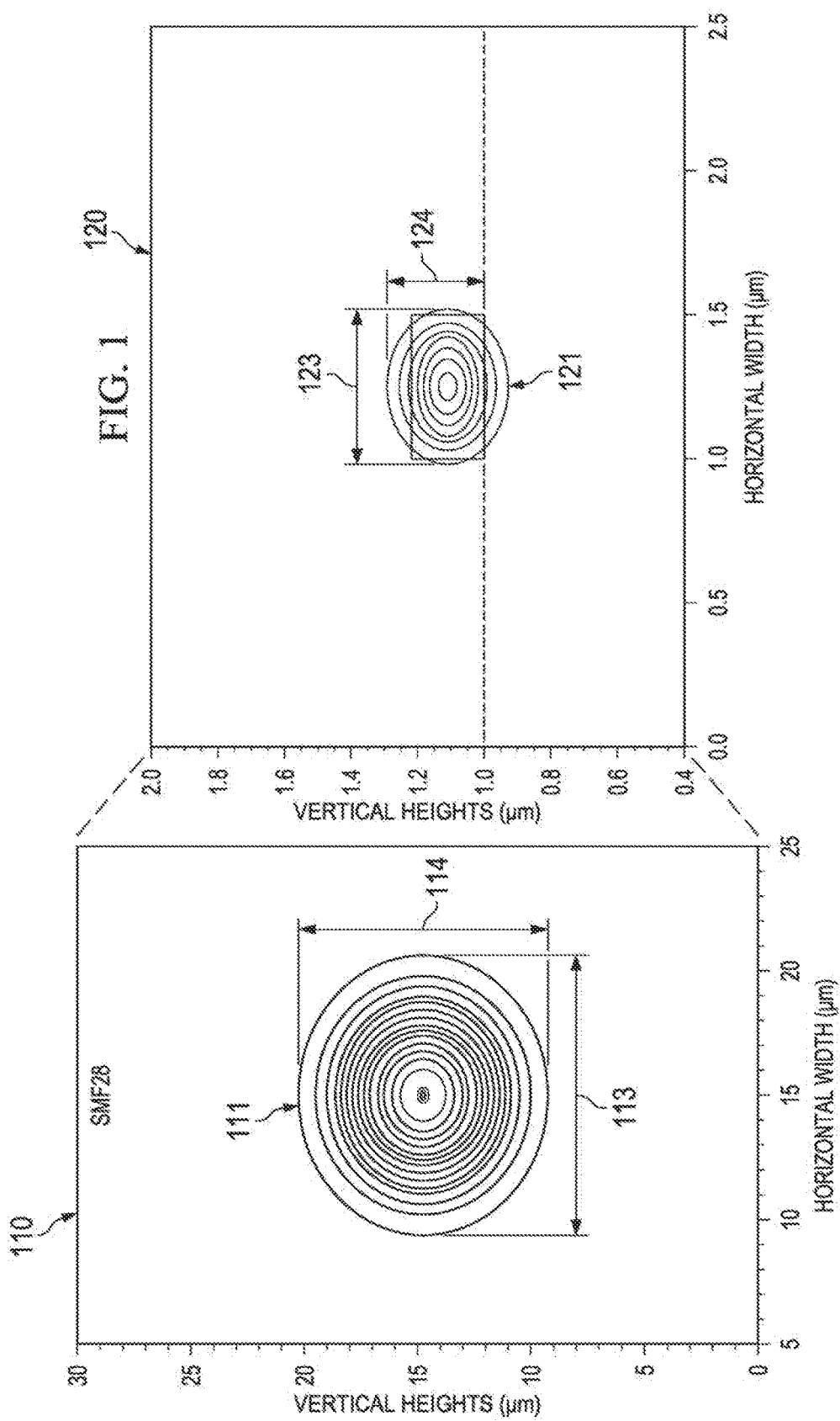
FIG. 1 shows optical power intensity distributions illustrating relative field sizes of a single-mode fiber (SMF) and a silicon (Si) waveguide.

It should be understood at the outset that, although an illustrative implementation of one or more embodiments are provided below, the disclosed systems and/or methods may be implemented using any number of techniques, whether currently known or later developed. The disclosure should in no way be limited to the illustrative implementations, drawings, and techniques illustrated below, including the designs and implementations illustrated and described herein, but may be modified within the scope of the appended claims along with their full scope of equivalent.

PICs are part of an emerging technology that employs light as opposed to an electric current as a basis of operation. A silicon-on-insulator (SOI) platform is a promising platform for high-density integrated optics due to the large refractive index contrast between the Si waveguide core and the silicon dioxide ($SiO_2$) cladding layer. However, one of the drawbacks of the high refractive index contrast is the mismatch between the size of an SOI waveguide mode and that of an SMF, which provides inputs and outputs to and from the PIC chip. For example, an SOI waveguide may have a cross section in a submicron size range that is less than one micrometer ($\mu m$), while an SMF may have a cross section that is tens of $\mu m$. Thus, efficient coupling of optical signals between the optical fiber and the SOI waveguide circuit or the PIC is challenging.

Disclosed herein are embodiments for improving PIC edge coupling efficiency by implementing 3D mode conversion and pitch adaptation on a single chip. The disclosed embodiments employ a 3D PIC interposer to couple a fiber array to a PIC edge coupling array. The disclosed PIC interposer includes a plurality of waveguides arranged in an array configuration. The 3D mode conversion includes a vertical mode size conversion and a lateral mode size conversion. The vertical mode size conversion refers to changing the height or the thickness of the waveguide in a direction perpendicular to a wafer plane to adapt to the mode size of a fiber in a vertical direction. The lateral mode size conversion refers to changing the width of the waveguide in a direction parallel to the wafer plane to adapt to the mode size of a fiber in a lateral direction. For example, each of the waveguides has a 3D tapered structure that gradually decreases in width and in height from one end to another end such that the smaller end matches the mode size of a PIC on-chip waveguide and the larger end matches the mode size of an optical fiber. In addition, the waveguides are arranged in a fan-in or fan-out configuration to match the pitch differences between an optical fiber array and a PIC edge coupling array. The disclosed 3D PIC interposer is built by employing PLC technologies. The disclosed embodiments employ an ion-exchange process to fabricate the 3D PLC interposer by forming a waveguide mask layer on a substrate platform, such as a sodium-rich glass substrate, and immersing the substrate platform into a salt melt, such as a silver nitrate ($AgNO_3$) compound, at a controlled rate. The waveguide mask layer is patterned with an array of mask openings corresponding to the positions at which waveguides may be formed from the ion-exchange process. Each mask opening is patterned with a tapered width such that the waveguides formed from the ion-exchange process may have a tapered width. The immersion rate may be controlled such that different portions of the substrate platform are exposed to the salt melt for sufficiently different amounts of time. By varying the amounts of time that the portions are exposed to the salt melt, different amounts of ions may diffuse into the substrate platform through the mask openings, for example, replacing the sodium ($Na^+$) ions in the glass substrate with the silver ($Ag^+$) ions from the salt melt, thus creating ion-exchanged channels in the glass substrate with varying depths or heights. Therefore, waveguides with a desired tapered height may be fabricated by controlling the rate at which the substrate platform is immersed into the salt melt. Some other mechanisms that may be employed to generate the tapered height may include controlling the temperature gradient and/or the ion concentration of the salt melt.

FIG. 1 shows optical power intensity distributions 110 and 120 illustrating relative field sizes of an SMF and an Si waveguide. In the plots 110 and 120, the x-axes represent horizontal widths in units of $\mu m$ and the y-axes represent vertical heights in units of $\mu m$. The plot 110 shows an intensity distribution pattern 111 in the cross section of the SMF. The plot 120 shows an intensity distribution pattern 121 in the cross section of the Si waveguide, for example, in a transverse-electric (TE) plane. As shown in the plots 110 and 120, the intensity distribution pattern 111 extends a width 113 of about 10 $\mu m$ and a height 114 of about 10 $\mu m$, whereas the intensity distribution pattern 121 has a significantly smaller dimension with a width 123 and a height 124. For example, a typical SMF may produce an intensity distribution with a width of about 500 nanometers (nm) and a height of about 220 nm. The intensity distribution pattern 111 corresponds to a mode size of the SMF. The intensity distribution pattern 121 corresponds to a mode size of a typical Si waveguide. As shown, there is a significant mode size mismatch between the SMF and the Si waveguide. Thus, coupling an optical fiber to an Si waveguide without a mode size conversion may lead to a high optical loss.

Figure 2:
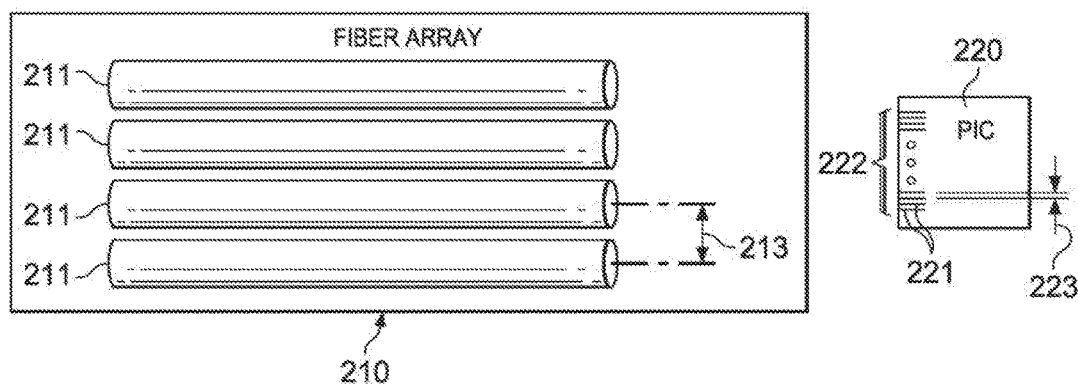
FIG. 2 is a schematic diagram illustrating a pitch mismatch between a fiber array and an input/output (I/O) array of a PIC.

FIG. 2 is a schematic diagram illustrating a pitch mismatch between a fiber array 210 and an input/output (I/O) array of a PIC 220. The fiber array 210 includes a plurality of optical fibers 211 arranged in an array configuration. The optical fibers 211 may be SMFs, multi-mode fibers (MMFs), or any other types of optical fibers. As shown, the optical fibers 211 are arranged such that the core centers of the optical fibers 211 are spaced at about a constant distance, where the center-to-center spacing between two optical fibers 211 is referred to as an array pitch 213. The fiber array 210 may be employed in applications that connect a large number of optical fibers to a highly integrated PIC, such as the PIC 220. Some commonly available fiber arrays in the industry may have an array pitch of about 125 $\mu m$.

The PIC 220 includes a PIC edge coupling array 222 disposed on a plane of the PIC 220 at a position adjacent to a surface of the PIC 220. The PIC edge coupling array 222 includes a plurality of waveguides 221 arranged in a similar array configuration as in the fiber array 210. The PIC edge coupling array 222 is configured to couple optical signals into and out of the PIC 220. For example, when employing the PIC 220 in an optical system, the PIC edge coupling array 222 may be configured to couple to the fiber array 210 to transfer optical signals between the PIC 220 and other parts of the optical system. However, the size of the PIC 220 is smaller than the size of the fiber array 210 and the cross-sectional dimensions of the waveguides 221 are smaller than the cross-sectional dimensions of the optical fibers 211. In addition, the waveguides 223 are densely packed together in the PIC edge coupling array 222. Thus, PIC edge coupling array 222 has an array pitch 223 significantly smaller than the array pitch 213. For example, some PIC edge couplers may have an array pitch of about 20 $\mu m$ as opposed to about 125 $\mu m$ in the fiber array 210. Thus, the array pitch 213 may be about ten or more times larger than the array pitch 223. Therefore, when coupling optical signals between the fiber array 210 and the PIC 220, the large pitch mismatch between the array pitch 213 and the array pitch 223 may limit coupling efficiencies.

Various types of PIC coupling systems and methods have been developed to improve coupling efficiency. There are two principal types of coupling technologies: in-plane coupling, and out-of-plane coupling. An example of an in-plane coupling mechanism is edge coupling, which is suitable for broadband wavelengths and is insensitive to polarizations. An in-plane mode converter may couple an in-plane optical fiber, such as the optical fiber 211, to a submicron waveguide, such as the waveguide 221, disposed on a plane of a PLC, such as the PIC 220, by aligning the optical fiber to an edge of the PLC, where in-plane refers to a plane parallel to the chip surface or a plane of the PIC. An example of an on-chip mode converter is described in C. Kopp, et al., "Silicon Photonic Circuits: On-CMOS Integration, Fiber Optical Coupling, and Packaging," Institute of Electrical and Electronics Engineers (IEEE) Journal of Selected Topics in Quantum Electronics, Vol. 17, No. 3, Oct. 7, 2010, which is incorporated herein by reference.

Figure 3:
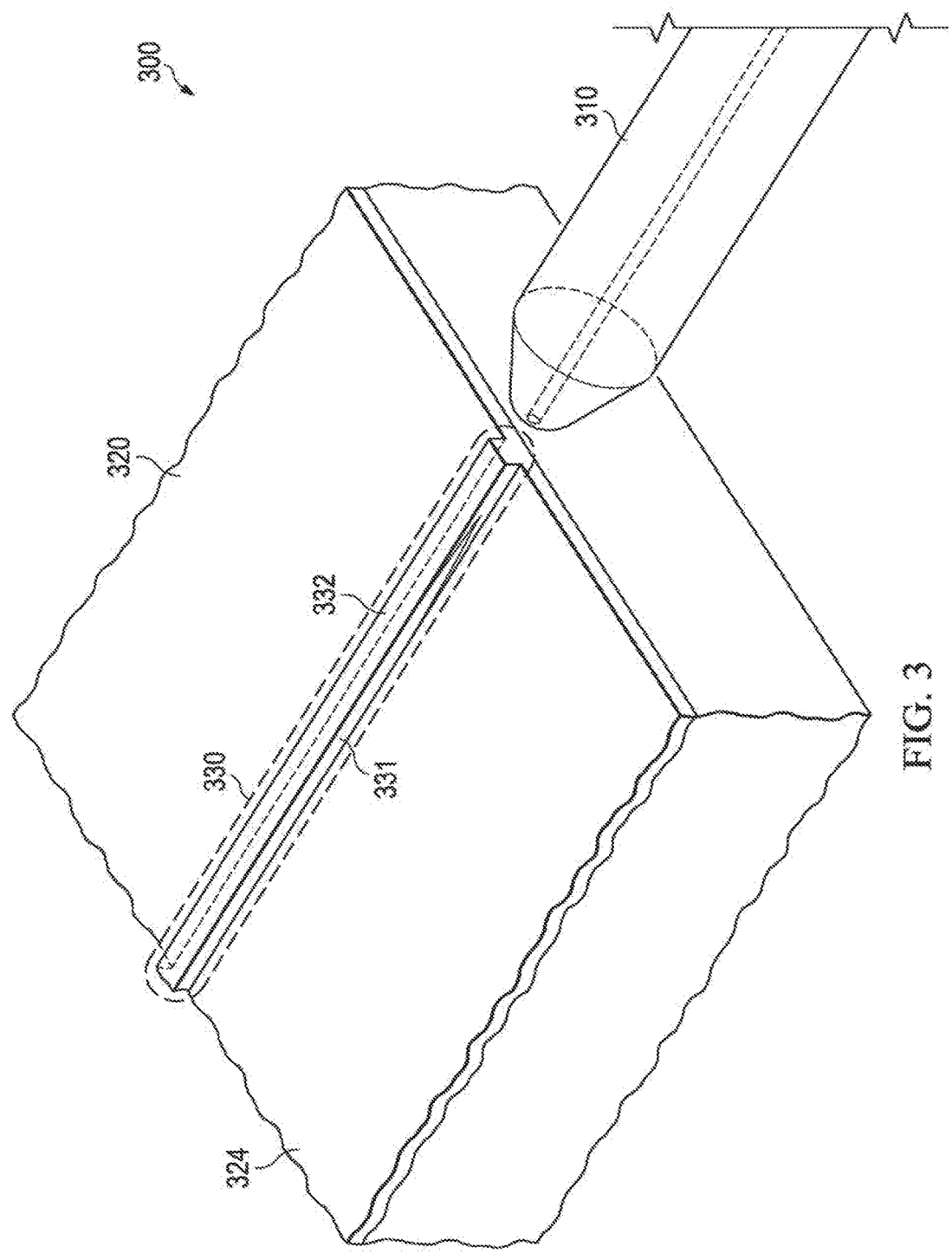
FIG. 3 is a schematic diagram of an edge coupling device that employs an on-chip mode converter.

FIG. 3 is a schematic diagram of an edge coupling system 300 that employs an on-chip mode converter 330. The system 300 includes a PIC 320 and an optical fiber 310. The optical fiber 310 may be an SMF or a lensed fiber. The optical fiber 310 is aligned in plane with the PIC 320 and couples to the PIC 320 at an edge of the PIC 320. The mode converter 330 is disposed on a wafer plane 324 of the PIC 320 and at a position near the edge of the PIC 320 at which the optical fiber 310 is coupled to the PIC 320. The mode converter 330 includes an inverse taper 331 and an overlaid cladding layer 332 that covers surfaces of the inverse taper 331, functioning as a mode confining waveguide which envelops the expanded mode by the inverse taper 331. The inverse taper 331 is characterized by a nano-tip that produces an enlarged optical mode that matches to the mode of the optical fiber 310. The inverse taper 331 may be constructed from Si and the overlaid cladding layer 332 may be constructed from silicon-rich silica, silicon oxide ($SiO_x$) or any other suitable materials that have an effective index between about 1.46 and about 1.72. The mode converter 330 may be fabricated by employing etching based techniques. Lateral tapers may be formed by employing etching-based techniques, where lateral tapers refer to tapers that have a tapering width in a horizontal or lateral direction with respect to the wafer plane 324. However, vertical tapers, which have a tapering height or thickness in a vertical direction with respect to the wafer plane 324, may not be reliably formed at the back end of line (BEOL) because many electrical pads may be located on the surface of the PIC chip for electrical integration.

An alternative approach to implementing a mode converter is to directly fabricate an inverse taper such as the inverse taper 331 on a top cladding such as the wafer plane 324 without a raised mode conversion waveguide such as the overlaid cladding 332. As such, the mode converter may be formed from a front end of line (FEOL) process. Thus, the mode converter may not affect the electrical integration on the PIC chip. However, this approach may provide a mode expansion only in a horizontal direction, but not in both horizontal and vertical directions. For example, the expanded mode near the edge of the PIC may have a mode size comparable to the mode size of an optical fiber, such as the optical fiber 310, in only a horizontal direction. As a result, the mode converter may reduce some coupling losses.

Figure 4:
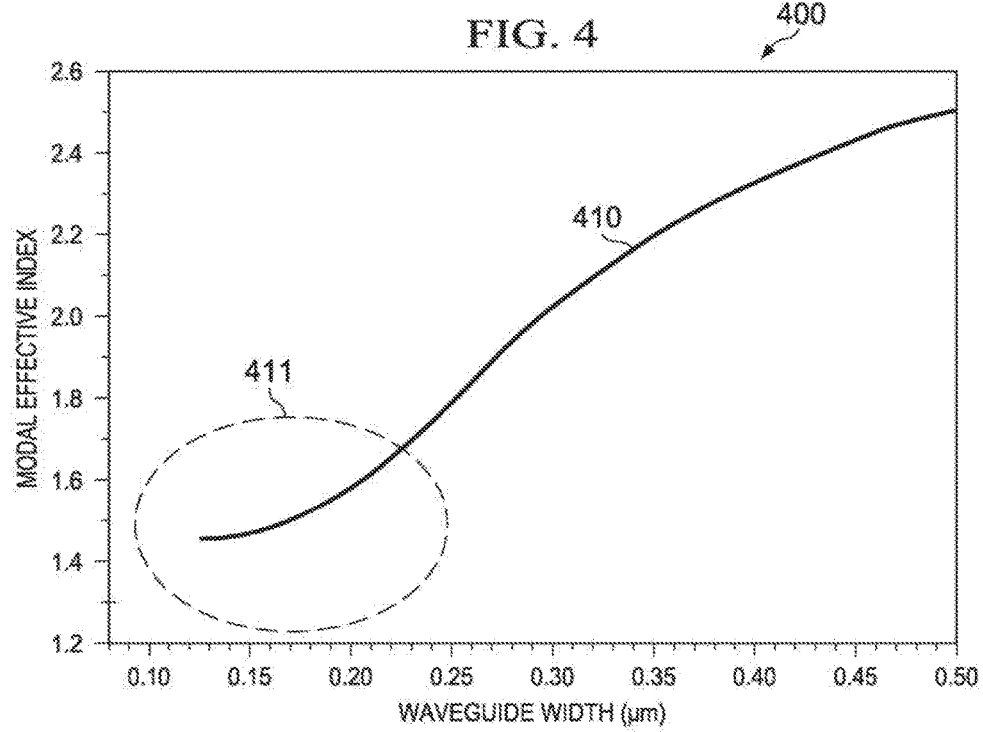
FIG. 4 is a graph illustrating variations in modal effective indexes with waveguide widths.

FIG. 4 is a graph 400 illustrating variations in modal effective indexes with waveguide widths. In the graph 400, the x-axis represents waveguide widths in units of μm and the y-axis represents modal effective indexes in some constant units. The plot 410 shows variations of modal effective indexes of an Si wire, such as the inverse taper 331, as a function of the widths of the Si wire. The modal effective indexes describe the speeds and the phase changes along a direction of optical signal propagation and the index contrast of the waveguide core versus the cladding. The modal effective indexes determine the mode field dimension of the propagation mode. As shown in the plot 410, the modal effective index decreases as the width decreases. For example, when the tip of the Si wire has a width less than about 150 nm (shown as region 411), the effective index is about 1.5, which is close to the silica fiber mode index. As such, the tip of the Si wire produces a mode field diameter that matches to both the waveguide and the fiber. Thus, when coupling an optical fiber to the tip of the Si wire, coupling loss may be reduced by designing the Si wire tip width in the region 411.

Some PICs, such as the PIC 220, may integrate a large number of functionalities on a single chip with multiple inputs and/or multiple outputs. Thus, a single PIC may be required to interface with a large number of optical fibers, such as the optical fibers 211 and 310, or a fiber array, such as the fiber array 210. Because PICs are compact in size, integrating multiple mode converters, such as the mode converter 330, on a single PIC may be challenging due to the PIC edge spacing limitation. Thus, some edge coupling systems employ an interposer to couple an array of fibers to a PIC including multiple input and/or output waveguides. An example of an interposer is described in "PLC-Transposer for Edge Coupling to Silicon PICs," PLC Connections LLC, May 8, 2013 ("PLC-Transposer"), which is incorporated herein by reference.

Figure 5:
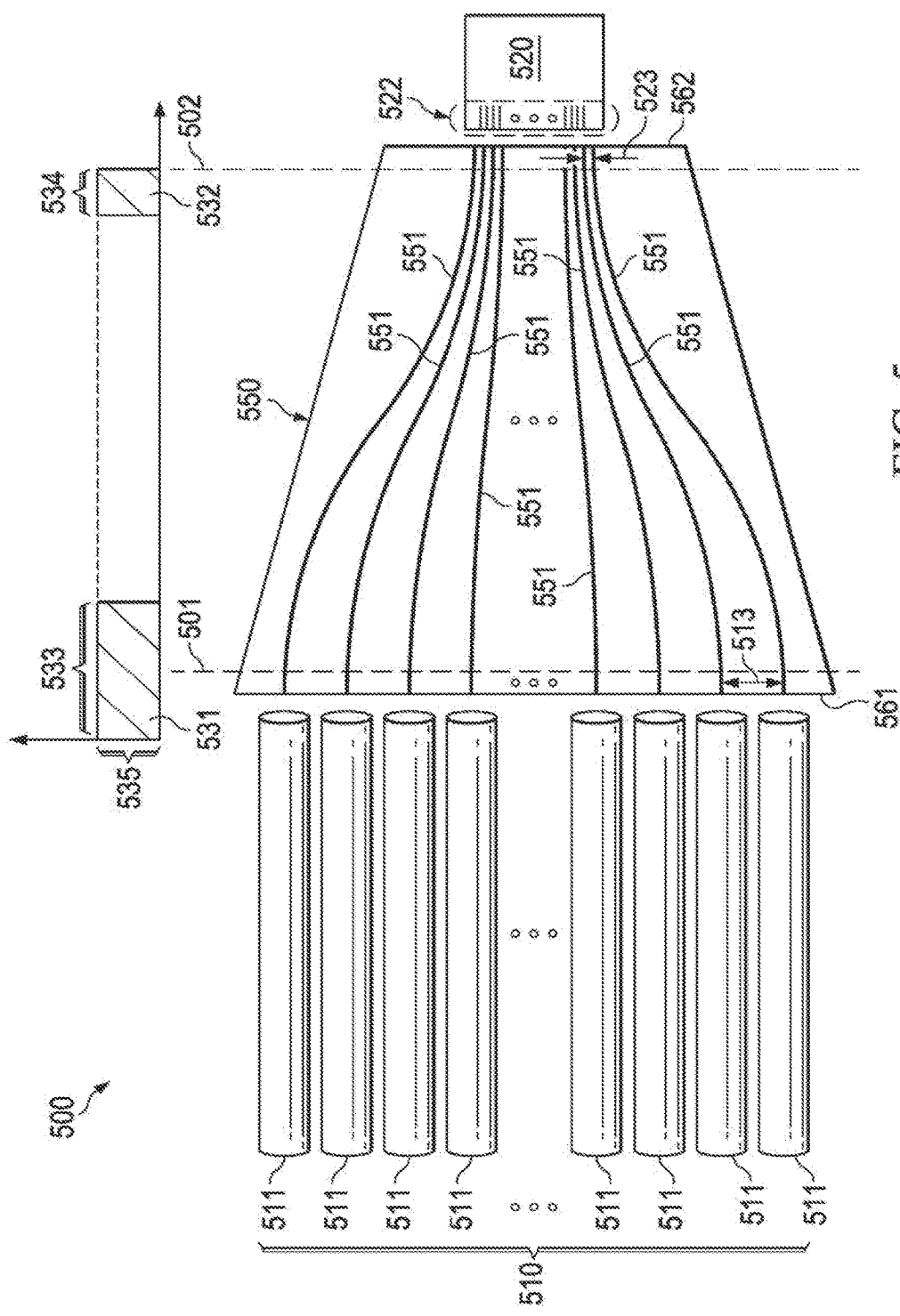
FIG. 5 is a schematic diagram of an edge coupling system that employs an interposer.

FIG. 5 is a schematic diagram of an edge coupling system 500 that employs an interposer 550. The system includes a PIC 520 similar to the PIC 220, a fiber array 510 similar to the fiber array 210, and the interposer 550. For example, the PIC 520 includes a PIC edge coupling array 522 similar to the PIC edge coupling array 222. The PIC edge coupling array 522 includes a plurality of waveguides 521 similar to the waveguides 221. The fiber array 510 includes a plurality of optical fibers 511 similar to the optical fibers 211 and 310. The interposer 550 includes a first surface 561 and a second surface 562 opposite the first surface 561. The interposer 550 is positioned between the PIC 520 and the fiber array 510 such that the first surface 561 is coupled to the fiber array 510 and the second surface 562 is coupled to the PIC 520. The interposer 550 further includes a plurality of waveguides 551 disposed on a wafer platform of the interposer 550. For example, the wafer platform of the interposer 550 may be constructed from material such as Sift that has a lower index contrast than the wafer platform of the PIC 520, and the waveguides 551 may have a larger dimension than the waveguides 521 on the PIC 520. The waveguides 551 are positioned such that they extend from the first surface 561 to the second surface 562. The waveguides 551 are arranged in a fan configuration to provide a larger pitch 513, for example, at about 125 μm, at the first surface 561 and a smaller pitch 523, for example, at about 20 μm, at the second surface 562, where the larger pitch 513 is similar to the array pitch of the fiber array 510 and the smaller pitch 523 is similar to the array pitch of the PIC edge coupling array 522.

In an embodiment, the interposer 550 is fabricated by employing PLC technologies. The waveguides 551 may be fabricated such that each waveguide 551 has a tapered structure that tapers down in the axis of optical signal propagation to provide mode size conversions in addition to pitch adaptations. However, current PLC technologies such as that described in PLC-Transposer are limited to a two-dimensional (2D) configuration. Thus, the waveguides 551 may be fabricated to provide a width conversion and a pitch adaptation in a horizontal direction, but may not provide a height conversion in a vertical direction. As shown, the cross-sectional area 531 of a waveguide 551 near the first surface 561 along a line 501 has a wider width 533, for example about 125 µm, and the cross-sectional area 532 of the waveguide 551 near the second surface 562 along a line 502 has a narrower width 534, for example about 20 µm, but both the cross-sectional areas 531 and 532 have the same height 535.

Figure 6:
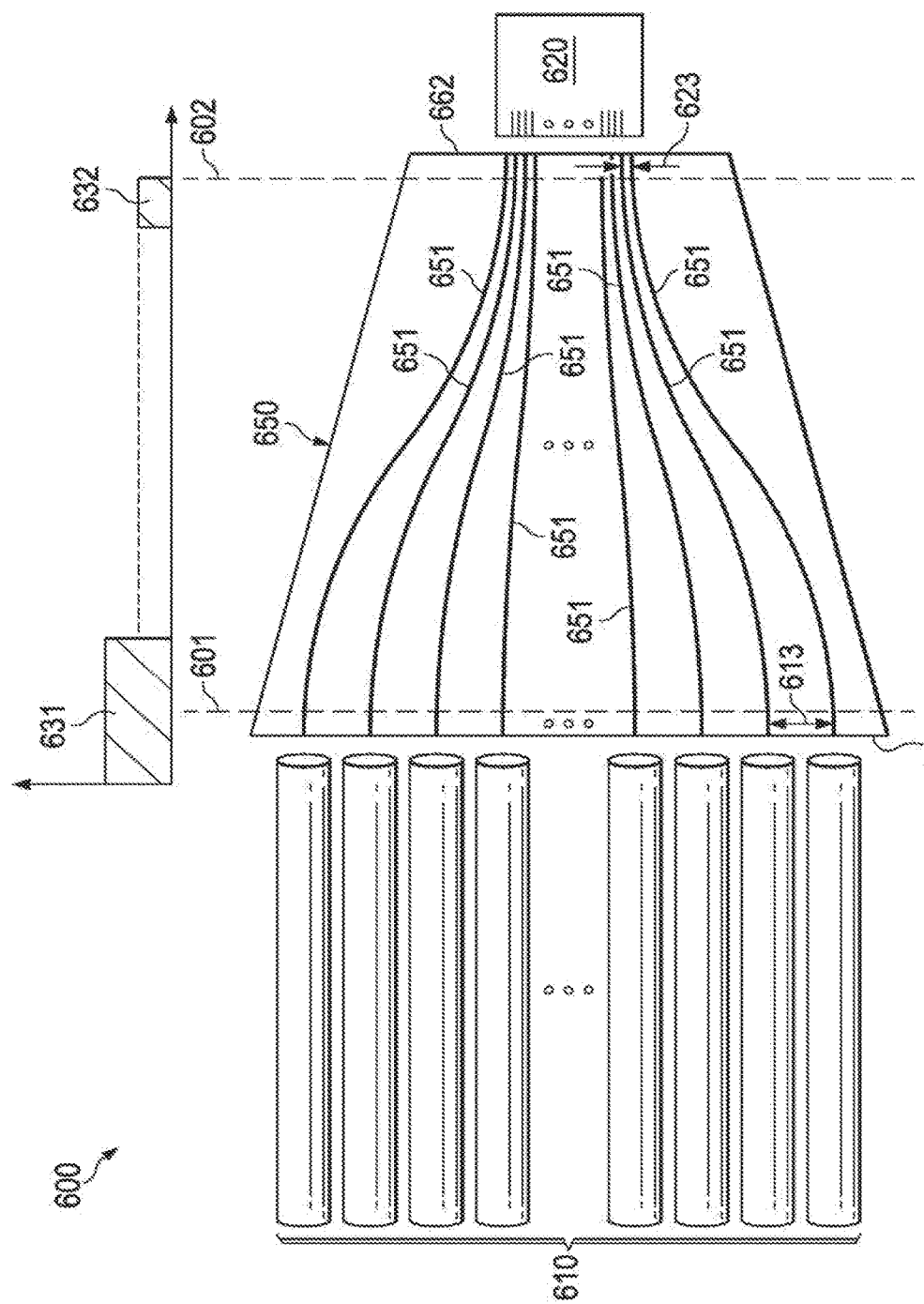
FIG. 6 is a schematic diagram of an edge coupling system that employs a 3D PIC interposer according to an embodiment of the disclosure.

FIG. 6 is a schematic diagram of an edge coupling system 600 that employs a 3D interposer 650 according to an embodiment of the disclosure. The system 600 is similar to the system 500, but employs the 3D interposer 650 to provide a 3D mode size conversion instead of a 2D mode size conversion as in the interposer 550. For example, the system 600 includes a PIC 620, similar to the PIC 520, a fiber array 610, similar to the fiber array 510, and the 3D interposer 650 positioned between the PIC 620 and the fiber array 610. The 3D interposer 650 includes an array of waveguides 651 arranged in a fan configuration to provide a pitch adaptation between the fiber array 610 and the PIC 620. For example, the waveguides 651 are positioned such that the array pitch 613 at a first surface 661 is greater than the array pitch 623 at a second surface 662, where the array pitch 613 is similar to the array pitch of the fiber array 610 and the array pitch 623 is similar to the array pitch of the PIC 620. As shown, the fan configuration employed in the 3D interposer 650 is similar to the fan configuration employed in the interposer 550. However, the configuration of the array of waveguides 651 may be alternatively arranged as determined by a person of ordinary skill in the art to provide the pitch adaptation.

Each waveguide 651 has a tapered structure that tapers down in width and height in the axis of optical signal propagation, for example, from the first surface 661 to the second surface 662, to provide a 3D mode conversion. As shown, the cross-sectional area 631 of a waveguide 651 near the first surface 661 along a line 601 has a greater height and width when compared to the cross-sectional area 632 of the waveguide 651 near the second surface 662 along a line 602. For example, the waveguides 651 have a mode width and a mode height similar to an optical fiber, such as the optical fiber 211, 310, and 511, near the first surface 661 and a mode width and a mode height similar to an Si photonic waveguide, such as the waveguides 221 and 521, near the second surface 662. Thus, the 3D interposer 650 may improve PIC coupling efficiency when compared to the interposer 550 that provides only a mode width conversion. Similarly to the interposer 550, the 3D interposer 650 may be fabricated by employing PLC technologies. However, in order to fabricate the waveguides 651 with the 3D tapered structure, an ion-exchange-based fabrication process may be employed, as discussed more fully below.

Figure 7:
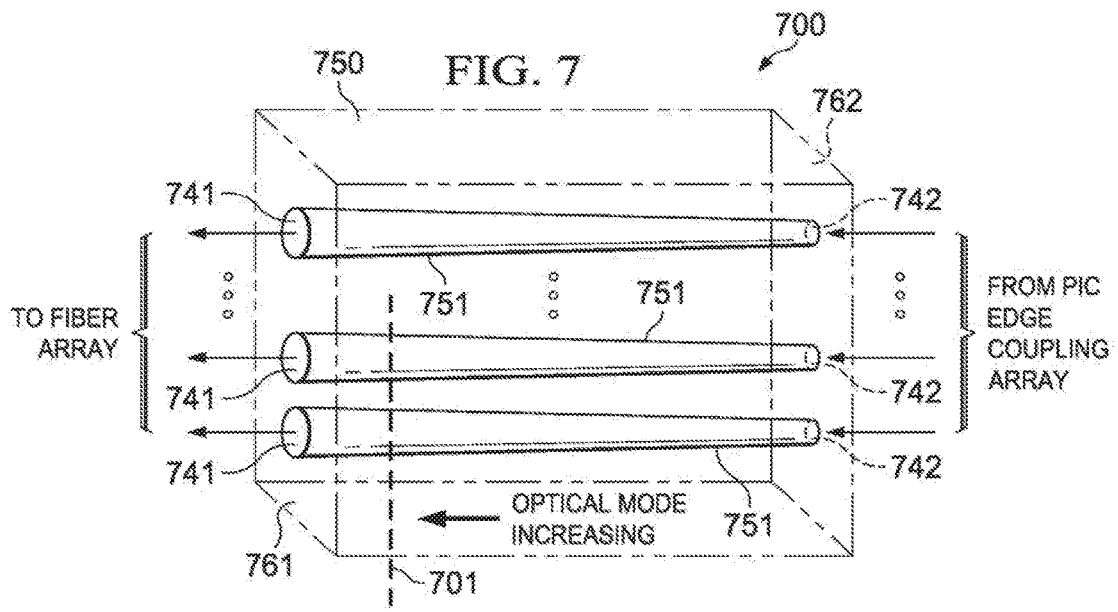
FIG. 7 is a schematic diagram of a 3D interposer according to an embodiment of the disclosure.

FIG. 7 is a schematic diagram of a 3D interposer 700 according to an embodiment of the disclosure. The 3D interposer 700 is similar to the 3D interposer 650 and provides a more detailed perspective view of the 3D interposer 650. The 3D interposer 700 may be employed in an edge coupling system, similar to the systems 500 and 600, to provide a 3D mode conversion between a fiber array, such as the fiber arrays 210, 510, and 610, and a PIC, such as the PICs 220, 520, and 620. The 3D interposer 700 includes a plurality of waveguides 751, similar to the waveguides 651, disposed in a glass substrate 750, such as a silica glass substrate. Each waveguide 751 has a structure that tapers down in width and height in the direction of light propagation from a first end 741 to a second end 742 of the waveguide 751 in order to provide a 3D mode conversion. As shown, the waveguides 751 are arranged such that the first ends 741 of the waveguides 751 are positioned near a first surface 761 for interfacing to a fiber array, such as the fiber arrays 210, 510, and 610, and the second ends 742 of the waveguide guides 751 are positioned near a second surface 762 for interfacing to a PIC, such as the PICs 220, 520, and 620. In addition to the 3D mode conversion, the waveguides 751 may be arranged in a fan configuration similar to the fan configuration in the 3D interposer 650 to provide a pitch adaptation. For example, the waveguides 751 may be spaced further apart at the first surface 761 to match the array pitch, such as the array pitch 213, of the fiber array and spaced closer at the second surface 762 to match the array pitch, such as the array pitch 223, of the PIC.

In an embodiment, the 3D interposer 700 further includes a first optical port positioned at the first surface 761 and a second optical port positioned at the second surface 762. The first optical port is configured to couple the first end 741 of the waveguides 751 to a fiber array. The second optical port is configured to couple the second end 742 of the waveguides 751 to a PIC. Thus, when the first optical port is an input port and configured to receive optical signals from the fiber array, the waveguides 751 gradually decrease the optical mode of the optical signals as the optical signals propagate down the waveguides 751 towards the second optical port to match the waveguide mode of the PIC. Conversely, when the second optical port is an input port and configured to receive optical signals from the PIC, the waveguides 751 gradually increase the optical mode size of the optical signals as the optical signals propagate down the waveguides 751 towards the first optical port to match the fiber mode of the fiber array.

Figure 8:
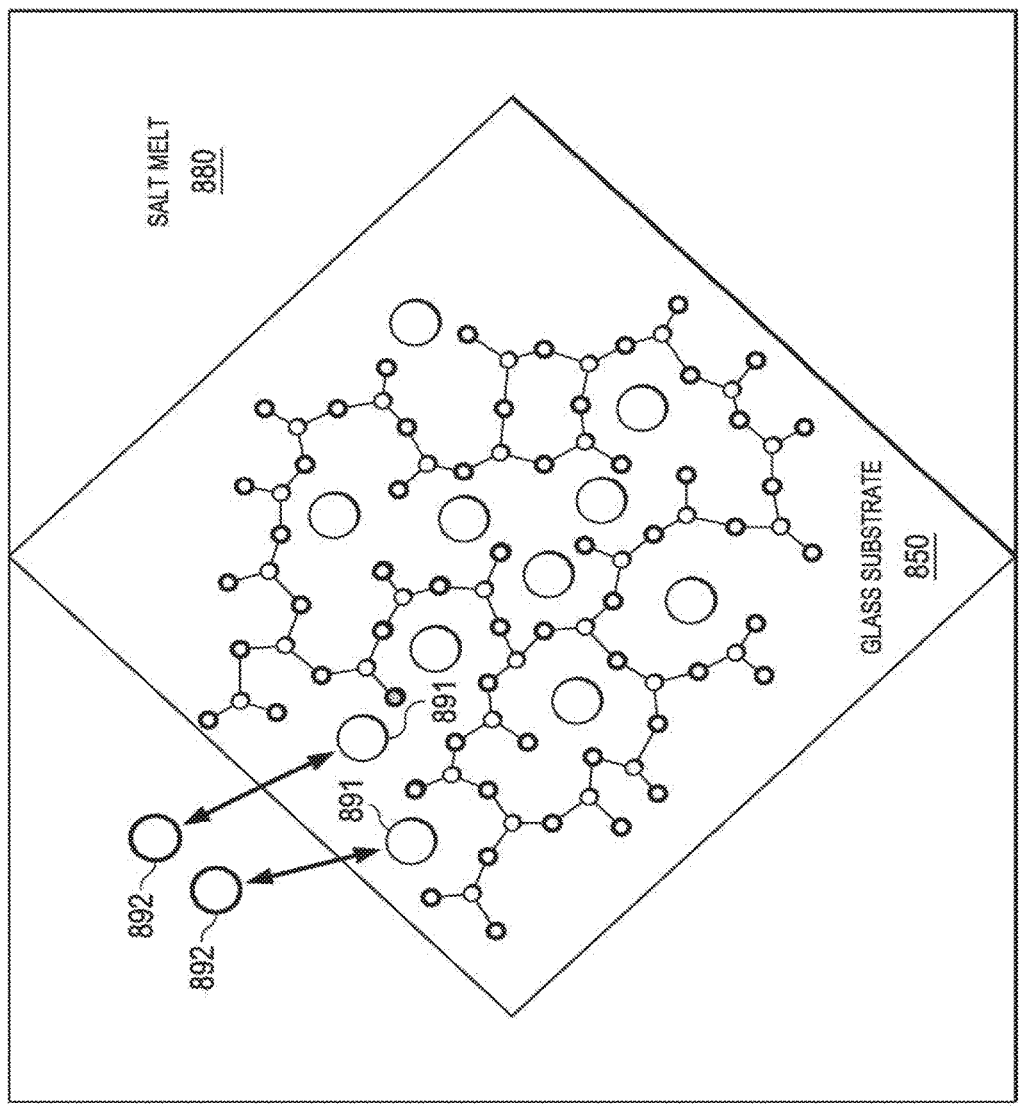
FIG. 8 is a schematic diagram illustrating an ion-exchange process.

FIG. 8 is a schematic diagram illustrating an ion-exchange process 800. The ion-exchange process 800 may be employed for fabricating waveguides, such as the waveguides 651 and 751. In the ion-exchange process 800, a glass substrate 850 is immersed into a salt melt 880, for example, in a crucible or container. For example, the glass substrate 850 is a sodium-rich glass substrate containing $Na^+$ ions 891, and the salt melt is an $AgNO_3$ compound containing $Ag^+$ ions 892. When the glass substrate 850 is immersed into the salt melt 880, the $Ag^+$ ions 892 diffuse into the glass substrate 850 and replace the $Na^+$ ions 891 in the glass substrate 850. The diffusion of the $Ag^+$ ions 892 into the glass substrate 850 increases the index of refraction, and under appropriate conditions results in optical waveguides if the ion diffusion is limited in a channel.

Figure 9:
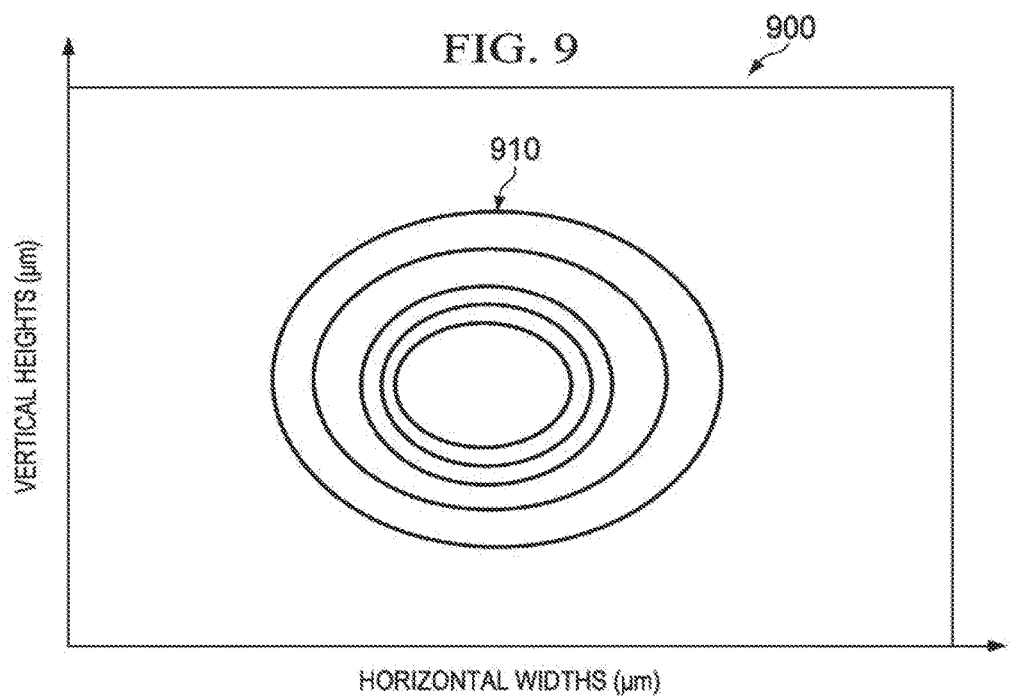
FIG. 9 is an intensity distribution plot of an ion-exchanged single-mode waveguide.

FIG. 9 is an intensity distribution plot 900 of an ion-exchanged single-mode waveguide. For example, the ion-exchanged waveguide is fabricated by employing an ion-exchange process similar to the ion-exchange process 800. In the plot 900, the x-axis represents horizontal widths in some arbitrary constant units and the y-axis represents vertical heights in some arbitrary constant units. The plot 900 shows an intensity distribution pattern 910 in the cross section of the ion-exchanged waveguide. It should be noted that the cross-sectional shape of a waveguide fabricated from an ion-exchange process may vary depending on the materials employed for the ion-exchange process and the openings of the mask. For example, the circular-shaped intensity distribution pattern 910 may correspond to an ion-exchanged waveguide fabricated by exchanging $Ag^+$ ions with $Na^+$ ions in a glass substrate, such as the glass substrate 850.

Figure 10:
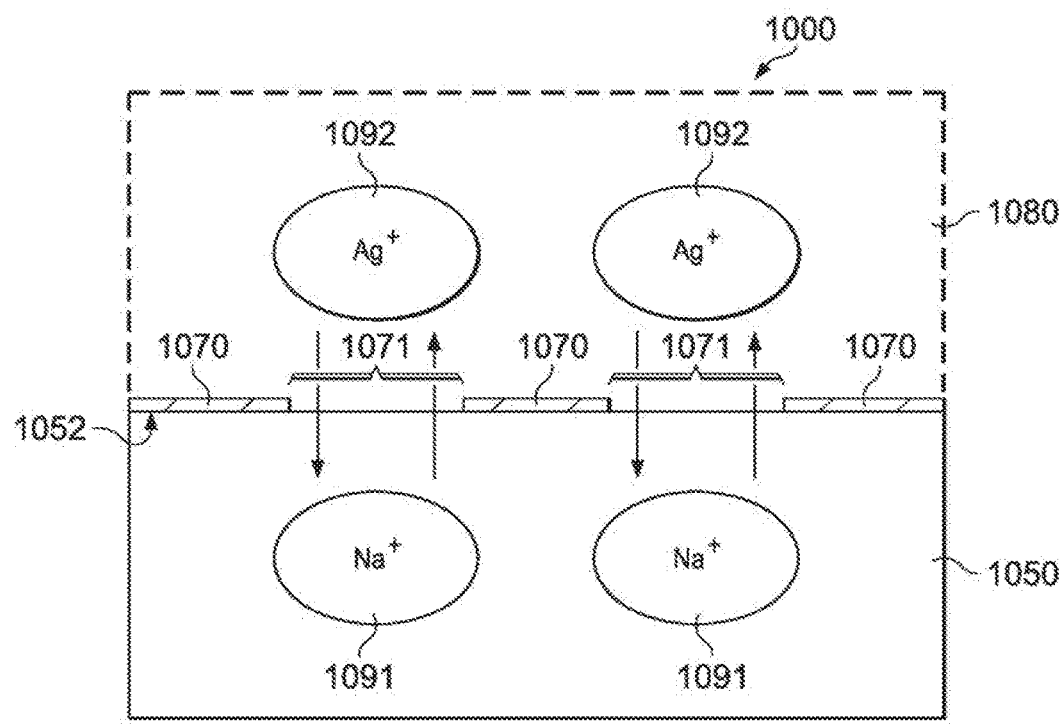
FIG. 10 is a schematic diagram illustrating a method for performing an ion-exchange process.

FIG. 10 is a schematic diagram illustrating a method 1000 for performing an ion-exchange process. The method 1000 is implemented when fabricating a 3D interposer, such as the 3D interposers 650 and 700. The method 1000 employs similar mechanisms as in the ion-exchange process 800. The method 1000 begins with immersing a glass substrate 1050 into a salt melt 1080. The glass substrate 1050 is similar to the glass substrate 850 and contains $Na^+$ ions 1091. The salt melt 1080 is similar to the salt melt 880 and contains $Ag^+$ ions 1092. The glass substrate 1050 illustrates a cross section of a portion of the glass substrate 750 along a line 701. The glass substrate 1050 is patterned with a waveguide mask 1070 at a surface 1052 of the glass substrate 1050, for example, by employing a photolithography process. The waveguide mask 1070 includes a plurality of openings 1071. For example, the waveguide mask 1070 has a pattern similar to the interposers 650 and 700, where the openings 1071 may correspond to the positions at which waveguides, such as the waveguides 651 and 751, are to be formed via an ion-exchange process. As shown, when the glass substrate 1050 is immersed into the salt melt 1080, the differences in ion concentrations between the glass substrate 1050 and the salt melt 1080 cause the ion-exchange process in which the $Ag^+$ ions 1092 diffuse into the glass substrate 1050 and the $Na^+$ ions 1091 diffuse into the salt melt 1080. Thus, the $Na^+$ ions 1091 in the glass substrate 1050 are replaced by the $Ag^+$ ions 1092. The diffusion of the $Ag^+$ ions 1092 into the glass substrate 1050 increases the refractive index of the regions at which the $Ag^+$ ions 1092 are disposed, thereby forming waveguides, such as the waveguides 651 and 751, at the ion-exchanged regions. It should be noted that the method 1000 may alternatively implant the $Ag^+$ ions 1092 into the glass substrate 1050, for example, via some ion implantation process, instead of immersing the glass substrate 1050 into the salt melt 1080. In addition, the ion-exchange process may employ other types of ion sources for the salt bath and/or a glass substrate including a different type of ions.

Figure 11:
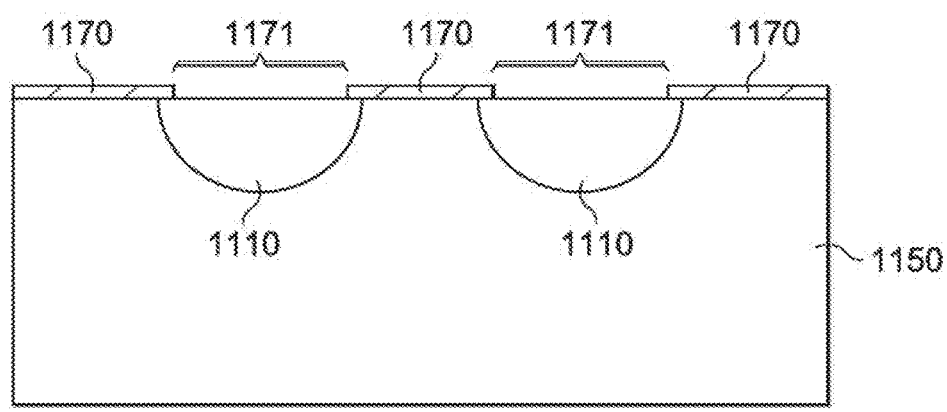
FIG. 11 is a cross-sectional view of an ion-exchanged glass substrate.

FIG. 11 is a cross-sectional view of an ion-exchanged glass substrate 1150. The cross-sectional view of the ion-exchanged glass substrate 1150 corresponds to a cross section of the glass substrate 750 along a line 701. The ion-exchanged glass substrate 1150 is fabricated by employing an ion-exchange process, similar to the process 800 and the method 1000. For example, the ion-exchanged glass substrate 1150 corresponds to the glass substrate 1050 after applying the method 1000. For example, the ion-exchanged glass substrate 1150 is photo masked with a waveguide mask 1170, similar to the waveguide mask 1070, that has openings 1171, similar to the openings 1071. As shown, the glass substrate 1150 includes a plurality of ion-exchanged regions 1110 corresponding to the formation of ions resulting from the ion-exchange process. In an embodiment, the ion-exchanged glass substrate 1150 is a sodium-rich glass substrate and the ion-exchange process employs a silver-rich salt melt, thus the ion-exchanged regions 1110 has a higher concentration of $Ag^+$ ions, than $Na^+$ ions. The ion-exchanged regions 1110 correspond to ion-exchanged waveguides that may be formed from the ion-exchange process in the glass substrate 1150.

Figure 12:
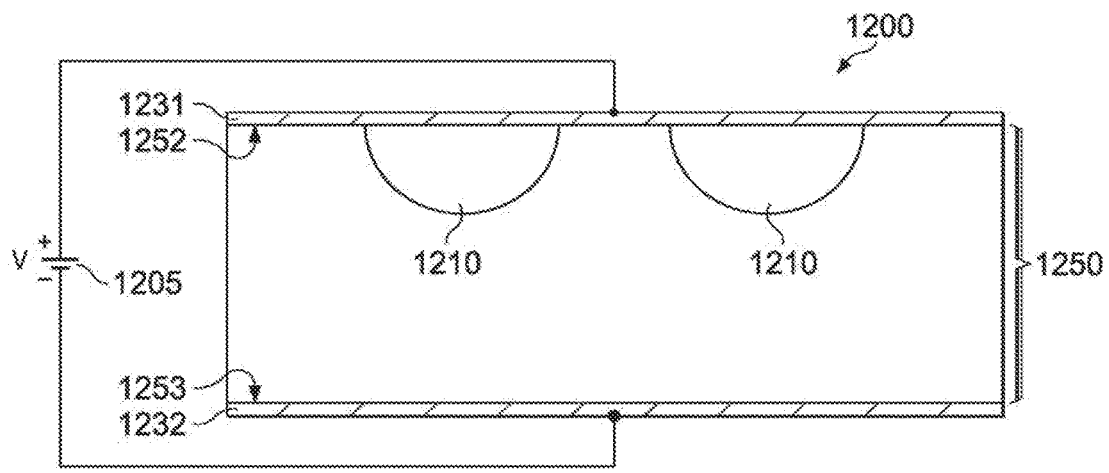
FIG. 12 is a schematic diagram illustrating a method for burying ion-exchanged waveguides in a glass substrate.

FIG. 12 is a schematic diagram illustrating a method 1200 for burying ion-exchanged waveguides 1210 in a glass substrate 1250. The method 1200 is employed in a fabrication process for fabricating a 3D interposer, such as the 3D interposers 650 and 700. The fabrication process may begin with an ion-exchange process as described in the method 1000. The method 1200 begins after completing the method moo. The glass substrate 1250 includes the ion-exchanged waveguides 1210. The glass substrate 1250 is similar to the glass substrate 1150, and the ion-exchanged waveguides 1210 correspond to the ion-exchanged regions 1110. However, the glass substrate 1250 corresponds to the glass substrate 1150 after removing the waveguide mask 1170 from the glass substrate 1150. As shown, the ion-exchanged waveguides 1210 are formed near a first surface 1252 of the glass substrate 1250. In the method 1200, an electrical field 1205 is applied across the glass substrate 1250 to bury the ion-exchanged waveguides 1210 deeper into the glass substrate 1250. The electrical field 1205 is applied perpendicular to the ion-exchanged waveguides 1210. For example, a positive electrode 1231 may be placed on the first surface 1252 of the glass substrate 1250 and a negative electrode 1232 may be placed on an opposite, second surface 1253. It should be noted that a top cladding layer (not shown) may be formed on the ion-exchange waveguides 1210 by additional cladding layer deposition or coating.

Figure 13:
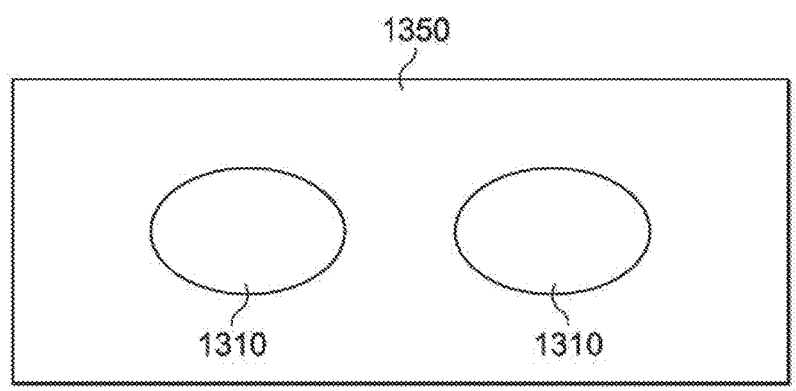
FIG. 13 is a cross-sectional view of a glass substrate including buried ion-exchanged waveguides.

FIG. 13 is a cross-sectional view of a glass substrate 1350 including buried ion-exchanged waveguides 1310. The cross-sectional view of the ion-exchanged glass substrate 1350 corresponds to a cross section of the glass substrate 750 along a line 701. First, the ion-exchanged waveguides 1310 are formed in the glass substrate 1350 by employing an ion-exchange process, such as the process 800 and the method 1000. Subsequently, the ion-exchanged waveguides 1310 are buried deeper into the glass substrate 1350 by employing similar mechanisms as described in the method 1200. For example, the ion-exchanged waveguides 1310 correspond to the ion-exchanged waveguides 1210 after applying the electrical field in the method 1200. As shown, the ion-exchanged waveguides 1310 are buried within the glass substrate 1350 away from the surface at which the ion-exchanged waveguides 1310 are first formed from the ion-exchange process.

Figure 14:
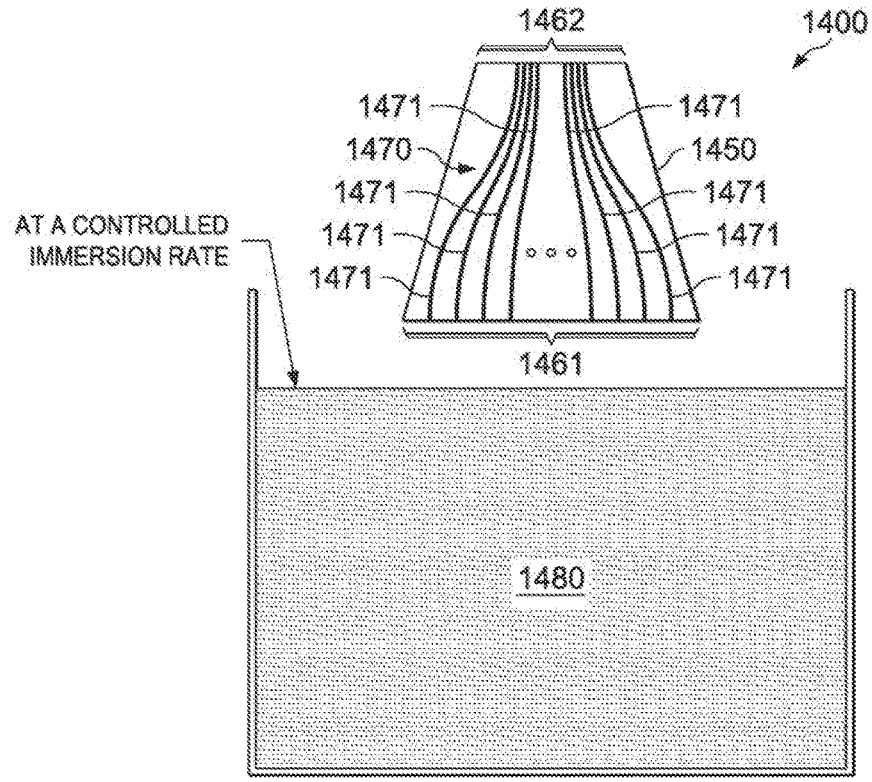
FIG. 14 is a schematic diagram illustrating a method for fabricating a 3D PIC interposer.

FIG. 14 is a schematic diagram illustrating a method 1400 for fabricating a 3D interposer, such as the 3D interposer 650 and 700, according to an embodiment of the disclosure. The method 1400 is implemented during the design and/or the manufacturing of the 3D interposer. The method 1400 begins with a glass wafer 1450, such as the glass substrates 750, 850, and 1050, masked by photolithography with a waveguide mask 1470, similar to the waveguide masks 1070 and 1170, on a first surface of the glass substrate 1450. The glass substrate 1450 includes a second surface (not shown) connected to the first surface along a first edge 1461 and a third surface (not shown) connected to the first surface along a second edge 1462. The second surface is opposite the third surface. As shown, the waveguide mask 1470 has an array of openings 1471 arranged in a pattern similar to the waveguides 651 in the 3D interposer 650. For example, the openings 1471 are patterned to space further apart and to have a wider width near the first edge 1461 than the second edge 1462. As described above, such a pattern may produce ion-exchanged waveguides with a tapered width and a reduced pitch during an ion-exchange process, such as the process 800 and the method 1200. Thus, pitch adaptations and mode width conversions may be achieved by designing the openings 1471 according to a pre-determined pitch reduction and a pre-determined mode width conversion when generating the waveguide mask 1470.

In the method 1400, the mode height conversion is achieved by controlling the rate at which the glass wafer 1450 is immersed into the salt melt 1480, such as the salt melts 880 and 1080. For example, the glass wafer 1450 may be a sodium-rich glass substrate including $Na^+$ ions, and the salt melt 1480 may be an $AgNO_3$ compound including $Ag^+$ ions. When the openings 1471 are exposed to the ions in the salt melt 1480 for a longer duration, a larger amount of $Ag^+$ ions may diffuse into the glass wafer 1450, thus resulting in a deeper ion diffusion depth into the glass wafer 1450. As such, the waveguides formed from the ion-exchanged regions may have a greater thickness or height. Therefore, by immersing the glass wafer 1450 at a sufficiently slow rate such that different portions of the openings 1471 are exposed to the $Ag^+$ ions for sufficiently different amounts of time, the waveguides formed from the ion-exchange process may have a tapered height or thickness. For example, when the glass wafer 1450 is immersed into the salt melt 1480 in a direction from the second surface to the third surface, the first edge 1461 at which the openings 1471 have a wider width and a greater array pitch is exposed to the $Ag^+$ ions for a longer duration than the second edge 1462. Thus, the waveguides formed from the ion-exchanged regions may have a 3D tapered structure with a tapered width, as well as a tapered height. It should be noted that the immersion rate may be dependent on various factors, such as the ion diffusion coefficient of the ion source, the temperature of the salt melt, and the concentration of the ion source in the salt melt. After completing the method 1400, the ion-exchanged waveguides may be buried deeper into the glass substrate 1450 further away from the first surface by employing similar mechanisms as described in the method 1200. For example, after the ion-exchanged waveguides are buried deeper into the glass substrate 1450, the ion-exchanged waveguides extend from the second surface to the third surface.

Figure 15:
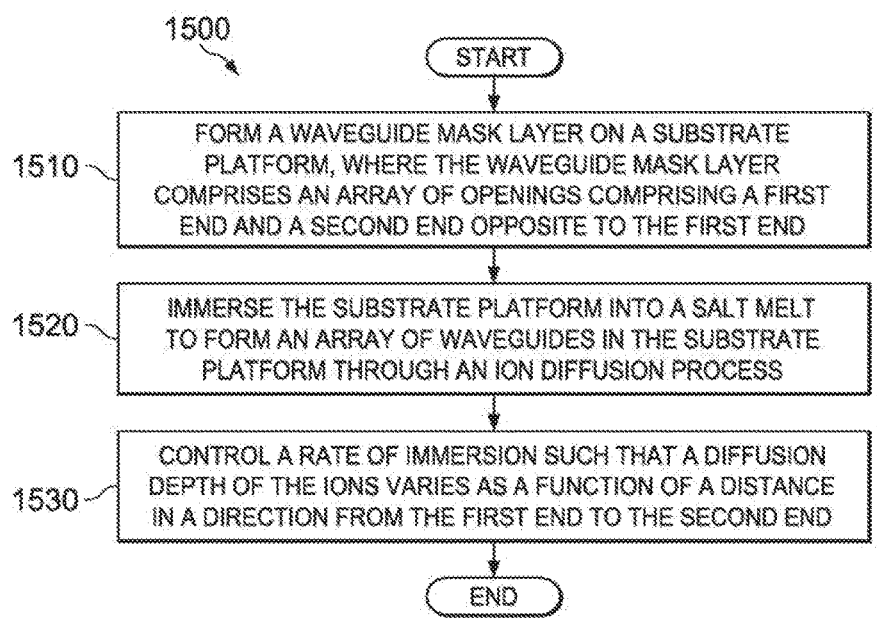
FIG. 15 is a flowchart of a method for fabricating a 3D PIC interposer according to an embodiment of the disclosure.

FIG. 15 is a flowchart of a method 1500 for fabricating a 3D interposer, such as 3D interposers 650 and 700, according to an embodiment of the disclosure. The method 1500 is implemented when designing and/or manufacturing the 3D interposer. The method 1500 is similar to the method 1400. At step 1510, a waveguide mask layer, such as the waveguide masks 1070, 1170, and 1470, is formed on a surface of a substrate platform, such as the glass substrate 1050. For example, the substrate platform may be constructed from a sodium-rich glass substrate. The waveguide mask layer has an array of openings, such as the openings 1071, 1171, and 1471. The array of openings has a first end and a second end. The array of openings allows the transfer of ions into the substrate platform to form waveguides. For example, the array of openings may have a pattern that fans in a direction from the first end to the send end, similar to the waveguides 651 on the 3D interposer 650 or the openings 1471 on the glass wafer 1450. In addition, the array of openings may have a tapered width that decreases in a direction from the first end to the second end.

At step 1520, the substrate platform is immersed into a salt melt, such as the salt melt 880 and 1480, to form an array of waveguides, such as the waveguides 651, 751, 1210, and 1310, in the substrate platform through an ion diffusion process. The salt melt provides a source of ions for the ion diffusion process. For example, the salt melt may be an $AgNO_3$ compound including $Ag^+$ ions. The immersion of the substrate platform into the salt melt causes the surface of the substrate platform at which the waveguide mask layer is formed to be in contact with the salt melt, thus causing the ion-diffusion process, where the $Ag^+$ ions in the salt melt diffuse into the substrate platform through the openings. For example, when the substrate platform is a sodium-rich glass substrate, a portion of the $Na^+$ ions in the glass substrate is replaced by the $Ag^+$ ions as described in the ion-exchange process 800 and the method moo. After the $Na^+$ ions are replaced by the $Ag^+$ ions, the ion-exchanged regions or channels in the glass substrate may have a cross section similar to the ion-exchanged glass substrate 1150. The sodium-silver ion-exchange process increases the refractive index of the glass substrate at the ion-exchanged regions, thus forming waveguides. It should be noted that the ion-exchange process may employ other types of ion sources, such as cesium ($Cs^+$), rubidium ($Rb^+$), lithium ($Li+$), potassium ($K^+$), and thallium ($Tl+$), suitable for the ion-exchange process.

At step 1530, a rate of immersion is controlled such that a diffusion depth of the ions varies as a function of a distance in a direction from the first end to the second end. For example, when the substrate platform is exposed to the salt melt for a longer duration, a larger amount of ions is diffused into the glass substrate from the salt melt, thus resulting in an ion-exchanged region with a greater depth or a greater height vertical to the surface of the substrate platform at which the waveguide mask layer is formed. Therefore, the thickness or vertical height of the waveguides formed from an ion-exchange process may be varied by adjusting the speed at which the substrate platform is immersed into the salt melt. For example, in order to fabricate waveguides that taper laterally and vertically, similar to the 3D interposer 650, the openings on the waveguide mask layer may have a width that tapers towards the second end and the substrate platform may be immersed into the salt melt such that the first end of the array of openings enters the salt melt first and the immersion rate may be adjusted such that the vertical height of the waveguides tapers down in a direction from the first end to the second end, similar to the method 1400.

The ion diffusion depth may be controlled by employing various mechanisms. In an embodiment, the ion diffusion depth may be controlled by controlling a temperature gradient of the salt melt, where a higher temperature increases the ion diffusion rate. For example, the salt melt may be adjusted such that the temperature increases with the depth of the salt melt. Thus, the substrate platform may be immersed into the salt melt such that the first end of the array of openings is in contact with the salt melt at which the depth is the greatest. In another embodiment, the ion diffusion depth may be controlled by controlling the concentration of the ion source in the salt melt, where a higher concentration increases the amount and/or the rate of ion diffusion. For example, the salt melt may be adjusted such that the concentration of the ions increases with the depth of the salt melt. Thus, the substrate platform may be immersed into the salt melt such that the first end of the array of openings is in contact with the salt melt at which the depth is the greatest. Although the present disclosure describes the employment of a salt melt as an external ion source for forming ion-exchanged waveguides, other mechanisms such as an ion-implantation process or a direct ultraviolet (UV) writing process may be employed to form ion-exchange waveguides.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A method of fabricating an optical coupling device, comprising:
    forming a waveguide mask layer on a surface of a substrate platform, the waveguide mask layer comprising an array of openings including a first end and a second end opposite to the first end, the forming the waveguide mask layer comprising tapering down a first width of each of the openings from the first end to the second end;
    immersing the substrate platform into a salt melt comprising ions to form an array of waveguides in the substrate platform through an ion diffusion process, the array of waveguides corresponding to the array of openings; and
    controlling a rate of the immersing such that a diffusion depth of the ions varies as a function of a distance in a direction from the first end to the second end, the array of waveguides extending in the direction from the first end to the second end, the controlling the rate of immersing comprising:
        exposing the first end to the ions for a longer duration than the second end to cause a height of the array of waveguides to taper down in a direction from the first end to the second end, the tapered down first width of each of the openings causing a second width of a respective one of the waveguides to taper down in the direction from the first end to the second end.

2. The method of claim 1, further comprising arranging the array of openings in a fan-in configuration that fans inward towards the second end, so that the array of waveguides comprises an array pitch that decreases in a direction from the first end to the second end.

3. The method of claim 1, further comprising constructing the substrate platform from a glass substrate.

4. The method of claim 1, wherein the substrate platform is a sodium-rich glass substrate comprising sodium ($Na^+$) ions, wherein the ions in the salt melt comprise silver ions ($Ag^+$), and wherein the ion diffusion process comprises replacing at least some of the $Na^+$ ions in the substrate platform with the $Ag^+$ ions in the salt melt.

5. The method of claim 1, wherein the substrate platform comprises Group III-V material ions, wherein the ions in the salt melt comprise silver ($Ag^+$) ions, cesium ($Cs^+$) ions, rubidium ($Rb^+$) ions, lithium ($Li^+$) ions, potassium ($K^+$) ions or thallium ($Tl^+$) ions, and wherein the ion diffusion process comprises replacing at least some of the Group III-V material ions in the substrate platform with the ions in the salt melt.

6. The method of claim 1, further comprising controlling a temperature gradient of the salt melt such that the salt melt comprises a temperature that increases with increasing depth of the salt melt.

7. The method of claim 1, further comprising controlling a concentration of the ions in the salt melt such that the concentration of the ions increases with increasing depth of the salt melt.

8. The method of claim 1, further comprising forming a top cladding layer on the array of waveguides.

9. A method of fabricating an optical coupling device, the method comprising:
    forming a waveguide mask layer on a first surface of a substrate platform, the substrate platform comprising a second surface adjacent to the first surface, a third surface adjacent to the first surface, and opposite to and parallel with the second surface, and a fourth surface adjacent to the second and third surfaces and opposite the first surface, the waveguide mask layer comprising an array of openings extending across the first surface of the substrate platform from the second surface of the substrate platform to the third surface of the substrate platform; and
    forming an array of waveguides in the substrate platform corresponding to the array of openings in the waveguide mask layer, the array of waveguides comprising ion channels formed using only a single masking process and extending from the second surface of the substrate platform to the third surface of the substrate platform;
    the array of waveguides formed with an array pitch with a large pitch end at the second surface of the substrate platform and a small pitch end at the third surface of the substrate platform; and
    each of the waveguides formed with a truncated cone-shaped structure that tapers down parallel to and perpendicular to the first surface from the large pitch end to the small pitch end.

10. The method of claim 9, wherein forming the array of waveguides comprises using an ion-exchange process.

11. The method of claim 10, wherein forming the array of waveguides comprises controlling an ion exchange rate such that a diffusion depth of ions in each waveguides varies as a function of a distance in a direction from the second surface to the third surface.

12. The method of claim 9, wherein forming the array of waveguides comprises using an ion-implantation process.

13. The method of claim 9, wherein the substrate platform comprises a sodium-rich glass substrate comprising sodium ($Na^+$) ions, and the waveguides comprise silver ($Ag^+$) ions.

14. The method of claim 9, wherein the substrate platform comprises Group III-V material ions, and wherein the waveguides comprise silver ($Ag^+$) ions, cesium ($Cs^+$) ions, rubidium ($Rb^+$) ions, lithium ($Li^+$) ions, potassium ($K^+$) ions or thallium ($Tl^+$) ions.

15. The method of claim 9, wherein forming the array of waveguides comprises:
    removing the waveguide mask layer from the first surface of the substrate platform; and
    applying an electrical field to the substrate platform to bury the array of waveguides in the substrate platform away from the first surface and the fourth surface.

16. The method of claim 9, further comprising forming a top cladding layer on the array of waveguides.

17. The method of claim 9, further comprising forming the waveguides spaced further apart at the second surface of the substrate platform than at the third surface of the substrate platform.

18. The method of claim 9, further comprising forming each waveguide with a single-mode fiber (SMF) mode size at the second surface of the substrate platform, and with a submicron silicon (Si) waveguide mode size at the third surface of the substrate platform.

19. The method of claim 9, wherein forming the array of waveguides comprises using an ion diffusion process.

20. The method of claim 9, wherein forming the array of waveguides comprises using an ultraviolet (UV) light writing process.

\* \* \* \* \*